United States Patent
Liu et al.

(10) Patent No.: US 9,853,112 B2
(45) Date of Patent: Dec. 26, 2017

(54) DEVICE AND METHOD TO CONNECT GATE REGIONS SEPARATED USING A GATE CUT

(71) Applicant: QUALCOMM Incorporated, San Diego, CA (US)

(72) Inventors: Yanxiang Liu, San Diego, TX (US); Stanley Seungchul Song, San Diego, CA (US); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/802,479

(22) Filed: Jul. 17, 2015

(65) Prior Publication Data

US 2017/0018620 A1    Jan. 19, 2017

(51) Int. Cl.
*H01L 23/538* (2006.01)
*H01L 27/092* (2006.01)
*H01L 29/66* (2006.01)
*H01L 29/423* (2006.01)
*G06F 17/50* (2006.01)
*H01L 21/8238* (2006.01)
*H01L 21/304* (2006.01)
*H01L 27/02* (2006.01)

(52) U.S. Cl.
CPC ...... *H01L 29/4238* (2013.01); *G06F 17/5077* (2013.01); *H01L 21/3043* (2013.01); *H01L 21/823821* (2013.01); *H01L 21/823828* (2013.01); *H01L 21/823871* (2013.01); *H01L 27/0207* (2013.01); *H01L 27/092* (2013.01); *H01L 27/0924* (2013.01); *H01L 29/6681* (2013.01); *H01L 23/5386* (2013.01)

(58) Field of Classification Search
CPC ............ H01L 29/4238; H01L 29/6681; H01L 27/0924; H01L 23/5221; H01L 23/5381; H01L 23/5386; H01L 27/14636; H01L 21/823828; H01L 21/823821; H01L 21/823871; H01L 21/3043
See application file for complete search history.

(56) References Cited

U.S. PATENT DOCUMENTS

| | | | |
|---|---|---|---|
| 7,939,384 B2 | 5/2011 | Chuang et al. | |
| 7,956,421 B2 | 6/2011 | Becker | |
| 8,561,003 B2 | 10/2013 | Kawa et al. | |
| 8,739,104 B1 * | 5/2014 | Penzes | H01L 27/0207 716/118 |
| 9,373,624 B1 * | 6/2016 | Balakrishnan | H01L 27/0924 |
| 2005/0022042 A1 * | 1/2005 | Tam | G06F 1/305 713/323 |
| 2005/0139924 A1 * | 6/2005 | Kim | H01L 27/124 257/347 |

(Continued)

OTHER PUBLICATIONS

International Search Report and Written Opinion—PCT/US2016/041542—ISA/EPO—dated Sep. 28, 2016.

*Primary Examiner* — Galina Yushina
(74) *Attorney, Agent, or Firm* — Toler Law Group, PC

(57) ABSTRACT

A method of fabrication of a device includes performing a gate cut to cut a gate line to create a first gate region and a second gate region. The method further includes depositing a conductive material to form a conductive jumper structure to connect the first gate region and the second gate region.

15 Claims, 7 Drawing Sheets

(56) References Cited

U.S. PATENT DOCUMENTS

| | | |
|---|---|---|
| 2007/0284671 A1 | 12/2007 | Tsutsumi et al. |
| 2010/0117157 A1 | 5/2010 | Miyake |
| 2013/0026571 A1* | 1/2013 | Kawa ................ H01L 27/0207 257/347 |
| 2013/0026572 A1 | 1/2013 | Kawa et al. |
| 2013/0062708 A1 | 3/2013 | Zhong et al. |
| 2013/0320451 A1 | 12/2013 | Liu et al. |
| 2014/0124868 A1* | 5/2014 | Kamal ................ H01L 27/0207 257/369 |
| 2014/0167172 A1* | 6/2014 | Chen ................ H01L 29/6681 257/368 |
| 2015/0001734 A1 | 1/2015 | Liu et al. |

\* cited by examiner

DEVICE AND METHOD TO CONNECT GATE REGIONS SEPARATED USING A GATE CUT

I. FIELD

This disclosure is generally related to electronic devices and more particularly to semiconductor devices.

II. DESCRIPTION OF RELATED ART

Certain semiconductor fabrication processes include forming a structure (e.g., polysilicon) and cutting the structure into multiple regions. In some circumstances, devices nearer to a cut may operate differently as compared to devices farther from the cut (i.e., the devices may be "mismatched"). Thus, performance of a device can deviate from a design specification of the device depending on the particular physical layout used to fabricate the device, which may reduce device performance or cause device malfunction.

Some fabrication techniques may avoid cuts. For example, a layout of a circuit may be rearranged to avoid a cut. This technique may reduce circuit performance (e.g., due to a greater amount of wiring to connect devices) and may increase circuit area in some cases. Some fabrication techniques may attempt to "isolate" devices from a cut, such as by specifying that certain devices are to be separated from a cut by at least a threshold distance. This technique may increase circuit area of a device and may increase fabrication process overhead (e.g., by creating additional design rules so that certain devices are separated from a cut by at least a threshold distance).

III. SUMMARY

A fabrication process may include forming a gate line of a device, such as gate line used to create gate terminals of one or more fin field-effect-transistor (finFET) devices. The fabrication process may also include cutting the gate line to define a first gate region and a second gate region and forming a conductive structure to connect the first gate region and the second gate region (e.g., to "reconnect" the gate line). Cutting the gate line may "distribute" strain associated with one or more neighboring devices, such as dummy finFET devices formed by cutting an adjacent gate line and filling in a dielectric between the dummy finFET devices. Focusing of strain on the device may be reduced or avoided, which may improve device performance. For example, in some cases, strain may increase saturation current magnitude of an n-type device (e.g., an n-type finFET) and may decrease saturation current magnitude of a p-type device (e.g., a p-type finFET), which may create a "mismatch" between saturation current magnitudes of the n-type device and the p-type device. "Distributing" strain may reduce or avoid "mismatch" of saturation current magnitudes due to strain. Reducing mismatch of n-type and p-type devices may improve operation of some circuits, such as an inverter circuit (e.g., by "balancing" operation of an n-type transistor of the inverter circuit and a p-type transistor of the inverter circuit).

Further, the conductive structure may be formed using an "existing" manufacturing stage of the fabrication process (e.g., without creating an additional operation or process flow associated with the fabrication process). For example, the conductive structure may be formed using a metal (M0) associated with a middle-of-line (MOL) processing stage of the device. In this example, focusing of stress on the gate line may be avoided using the conductive structure and without rearranging a device layout (e.g., to "isolate" a gate line from one or more other gate lines) or increasing distance between device components. Thus, the fabrication process may improve operation of an electronic device (e.g., by reducing or avoiding device "mismatch" caused by strain) without substantially increasing fabrication cost (e.g., by avoiding layout rearrangement), without substantially increasing device size (e.g., by avoiding increasing distance between device components), and without substantially increasing device complexity (e.g., by avoiding additional wiring to connect devices that have been rearranged).

In a particular example, a method of fabrication of a device includes performing a gate cut to cut a gate line (e.g., a structure used to form multiple transistor gate terminals) to create a first gate region and a second gate region. The method further includes depositing a conductive material to form a conductive structure (e.g., a conductive jumper) to connect the first gate region and the second gate region.

In another example, a computer-readable medium stores instructions that are executable by a processor to perform operations during fabrication of a device. The operations include initiating a gate cut to cut a gate line to create a first gate region and a second gate region. The operations further include initiating deposition of a conductive material to form a conductive jumper structure to connect the first gate region and the second gate region.

In another example, an apparatus includes a first device including a first gate region and a second device including a second gate region. The first gate region and the second gate region are formed from a gate line. The apparatus further includes a conductive jumper structure coupling the first gate region and the second gate region.

In another example, a method of generating design information associated with a device includes receiving data at a computer. The method further includes accessing the data to identify, by the computer, a gate line associated with the device. The method further includes generating design information by the computer in response to identifying the gate line. The design information indicates a first gate region cut from the gate line, a second gate region cut from the gate line, and a conductive jumper structure coupling the first gate region and the second gate region.

One particular advantage provided by at least one of the disclosed examples is increased similarity of device performance. For example, use of a conductive structure at a device may "distribute" strain associated with a neighboring device (instead of focusing the strain at the device). Avoiding focusing of strain can improve operation of the device. For example, because strain may affect certain components differently than other components (e.g., n-type devices may be affected differently as compared to p-type devices), unintended device "mismatch" may be reduced or avoided. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Certain examples are described below with reference to the drawings. In the description and the drawings, similar or common features may be indicated by common reference numbers.

Figure 1:
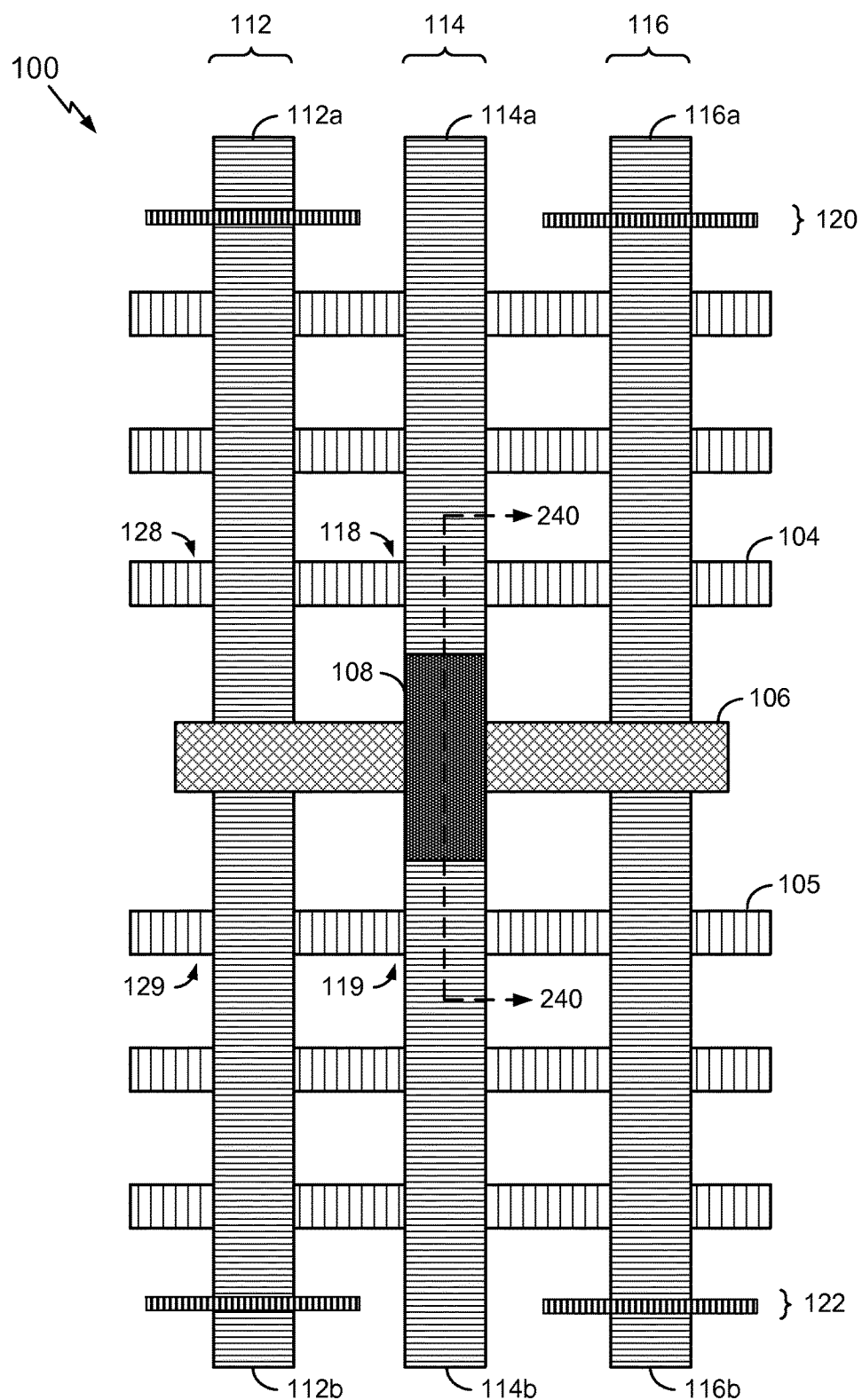
FIG. 1 is a layout view of an illustrative example of a device that includes a conductive structure to connect gate regions separated using a gate cut.

FIG. 1 depicts a layout view of an illustrative example of a device 100. The device 100 includes multiple gate lines, such as a first gate line 114 (e.g., a structure used to form multiple transistor gate regions). The device 100 may also include a second gate line 112 and a third gate line 116. The gates lines 112, 114, and 116 may include polycrystalline silicon (polysilicon or poly-Si) or metal, such as titanium nitride (TiN), tungsten (W), aluminum (Al), etc. The device 100 further includes multiple fins, such as a fin 104 and a fin 105. For example, the fins 105, 104 may be defined from a substrate (e.g., a silicon substrate) of the device 100 by etching the substrate.

Multiple devices (e.g., transistors) may be formed using a single gate line of the device 100. For example, two transistors may "share" the first gate line 114. To further illustrate, a first portion of the first gate line 114 disposed on the fin 104 may form a gate terminal of a first device 118. As another example, a second portion of the first gate line 114 disposed on the fin 105 may form a gate terminal of a second device 119. A device described herein may be fabricated using a three-dimensional or "multi-gate" device process, such as a fin field-effect-transistor (finFET) process. For example, the devices 118, 119 may be devices each having a gate region that "wraps" around a channel region, such as 3D finFET devices. In this example, the first device 118 may correspond to a first finFET, and the second device 119 may correspond to a second finFET. The devices 118, 119 may further include source and drain terminals formed in a substrate (omitted from FIG. 1 for clarity).

One or more of the gate lines 112, 114, and 116 may be coupled to a ground node (e.g., VSS) or to a supply voltage node (e.g., VDD). For example, FIG. 1 depicts that the gate lines 112, 116 may be coupled to a supply voltage node 120 and to a ground node 122. To further illustrate, the supply voltage node 120 and the ground node 122 may include metal, such as metal of a first metal layer (M1) associated with a metallization process. It should be appreciated that the example of FIG. 1 is illustrative and that the configuration of the device 100 may depend on the particular application.

In an illustrative implementation, the first gate line 114 functions as a "device-under-test" ("DUT"), and the gate lines 112, 116 function as dummy devices. As used herein, a "DUT" may refer to one or more active devices, such as a transistor having a channel region that can be selectively activated or deactivated by applying a bias voltage to a gate terminal of the transistor. To further illustrate, the first gate line 114 includes gate terminals of the devices 118, 119 (e.g., transistors). As used herein, a "dummy" device may refer to one or more passive devices, such as an n-type device having a gate terminal coupled to a ground node (e.g., the ground node 122) or a p-type device having a gate terminal coupled to a supply voltage node (e.g., the supply voltage node 120). In some applications, a dummy device may isolate (e.g., electrically isolate, mechanically isolate, or both) a DUT from one or more other devices. For example, the gate lines 112, 116 may include gate terminals of dummy devices that isolate one or more devices of the first gate line 114 from one or more other components. To illustrate, FIG. 1 depicts that a gate terminal of a first dummy device 128 may be formed from the second gate line 112 and that a gate terminal of a second dummy device 129 may be formed from the second gate line 112. The first dummy device 128 is adjacent to the first device 118 (e.g., the devices 118, 128 may "share" the fin 104), and the second dummy device 129 is adjacent to the second device 119 (e.g., the devices 128, 129 may "share" the fin 105).

In some cases, multiple gate terminals formed from a particular gate line may be separated using a gate cut. For example, if a gate terminal of the first dummy device 128 (e.g., a p-type dummy device, such as a p-type dummy finFET) and a gate terminal of the second dummy device 129 (e.g., an n-type dummy device, such as an n-type dummy finFET) are to be formed from the second gate line 112, the gate terminal of the first dummy device 128 may be electrically isolated from the gate terminal of the second dummy device 129 by cutting the second gate line 112 (in order to avoid a VDD-to-VSS short from the supply voltage node 120 to the ground node 122). As another example, if a gate terminal of a p-type dummy device and a gate terminal of an n-type dummy device are to be formed from the third gate line 116, the gate terminal of the p-type dummy device and the gate terminal of the n-type dummy device may be electrically isolated by cutting the third gate line 116.

In other cases, multiple gate terminals formed from another gate line may not be targeted for gate cut. To illustrate, a circuit schematic associated with the device 100 may specify that a gate terminal of the first device 118 is to be coupled to a gate terminal of the second device 119. As a particular illustrative example, the first device 118 may correspond to a p-type transistor (e.g., a p-type finFET) of an inverter, and the second device 119 may correspond to an n-type transistor (e.g., an n-type finFET) of the inverter.

Cutting a gate line may affect one or more neighboring (e.g., adjacent) gate lines that are not cut. For example, cutting a gate line may create a cavity that is filled with a dielectric, which may cause strain (e.g., tensile strain or compressive strain) on one or more neighboring gate lines. To illustrate, performing a gate cut at either of the gate lines 112, 116 may cause strain on the first gate line 114.

Some conventional techniques may include relocating the devices 118, 119 to another circuit area of the device 100 in order to reduce proximity of the devices 118, 119 to gate cuts associated with the gate lines 112, 116. Other conventional techniques may include avoiding gate cuts during fabrication of a device or increasing distance between the gate lines 112, 114, and 116. These techniques may increase device complexity (e.g., additional wiring), circuit area, and fabrication cost (e.g., by creating additional design rules for fabrication a device).

A technique in accordance with the disclosure includes cutting (e.g., using a flush cut) each of the gate lines 112, 114, and 116, such as by performing a gate cut at a gate cut region 106. The gate cut may be performed using an etching process or a scribing process (e.g., a laser scribing process), as illustrative examples. The gate cut may be performed at approximately a common location of the gate lines 112, 114, and 116 (e.g., at approximately the middle of the gate lines 112, 114, and 116, or at another location). Performing a gate cut at the gate cut region 106 may separate the second gate line 112 into gate regions 112a and 112b, the first gate line 114 into gate regions 114a and 114b, and the third gate line 116 into gate regions 116a and 116b.

After performing the gate cut at the gate cut region 106, one or more of the gate lines may be "reconnected" using a conductive structure, such as a conductive structure 108 (e.g., a metal jumper). To illustrate, if a circuit schematic associated with the device 100 indicates that gate terminals of the devices 118, 119 are to be connected (such as in the case of an inverter), the conductive structure 108 may be formed to couple (e.g., "reconnect") the gate regions 114a and 114b. The conductive structure 108 may connect a first gate terminal of the first device 118 to a second gate terminal of the second device 119. For example, the first gate terminal may include a portion of the first gate region 114a proximate to the fin 104, and the second gate terminal may include a portion of the second gate region 114b proximate to the fin 105.

In an illustrative implementation, the conductive structure 108 includes metal (M0) associated with a local interconnect process of the device 100. For example, the conductive structure 108 may be formed during a middle-of-line (MOL) processing stage of an integrated circuit. In another implementation, the conductive structure 108 may include a polysilicon material. The device 100 may include one or more local interconnects formed during the MOL processing stage that are distinct from the conductive structure 108 (not shown in FIG. 1).

Performing a gate cut at each of the gate lines 112, 114, and 116 may reduce strain on the devices 118, 119 as compared to performing the gate cut at only the gate lines 112, 116. For example, if lengths of the gate regions 112a, 112b, 114a, 114b, 116a, and 116b are substantially equal, strain on the devices 118, 119 may be reduced by "distributing" strain across the device 100 substantially equally (instead of focusing the strain at the devices 118, 119). Reducing strain on the devices 118, 119 may improve operation of the devices 118, 119, such as by reducing a gate cut effect (e.g., a change in saturation current magnitude of the devices 118, 119). Accordingly, the conductive structure 108 may reduce a gate cut effect at the device 100.

Alternatively or in addition to reducing a gate cut effect, a conductive structure may enable compliance with one or more design rules without relocation of device components. To illustrate, a design rule may specify a particular distance between gate lines targeted by a gate cut. As an example, the design rule may specify that two or more (uncut) gate lines are to separate gate lines targeted by a gate cut. In this example, the device 100 may be noncompliant with the design rule if the gate lines 112, 116 are targeted for a gate cut. Conventional techniques may relocate one or more gate lines to enable compliance with the design rule, which may result in additional circuitry (e.g., wiring) and fabrication cost. Cutting the first gate line 114 to create the gate regions 114a and 114b and "reconnecting" the gate regions 114a and 114b using the conductive structure 108 may enable compliance with the design rule without relocation of one or more device components.

Use of the conductive structure 108 may reduce manufacturing cost as compared to other techniques. To illustrate, certain existing techniques may avoid a gate cut at the first gate line 114 by relocating components of the device 100 (to avoid a gate cut effect or to enable compliance with one or more design rules). Relocating one or more device components may increase circuit area of a device and may increase fabrication process overhead (e.g., by increasing an amount of wiring to connect devices and by creating additional design rules). The conductive structure 108 may enable fabrication of the device 100 without "relocating" device components. Thus, manufacturing cost of the device 100 may be reduced.

Figure 2:
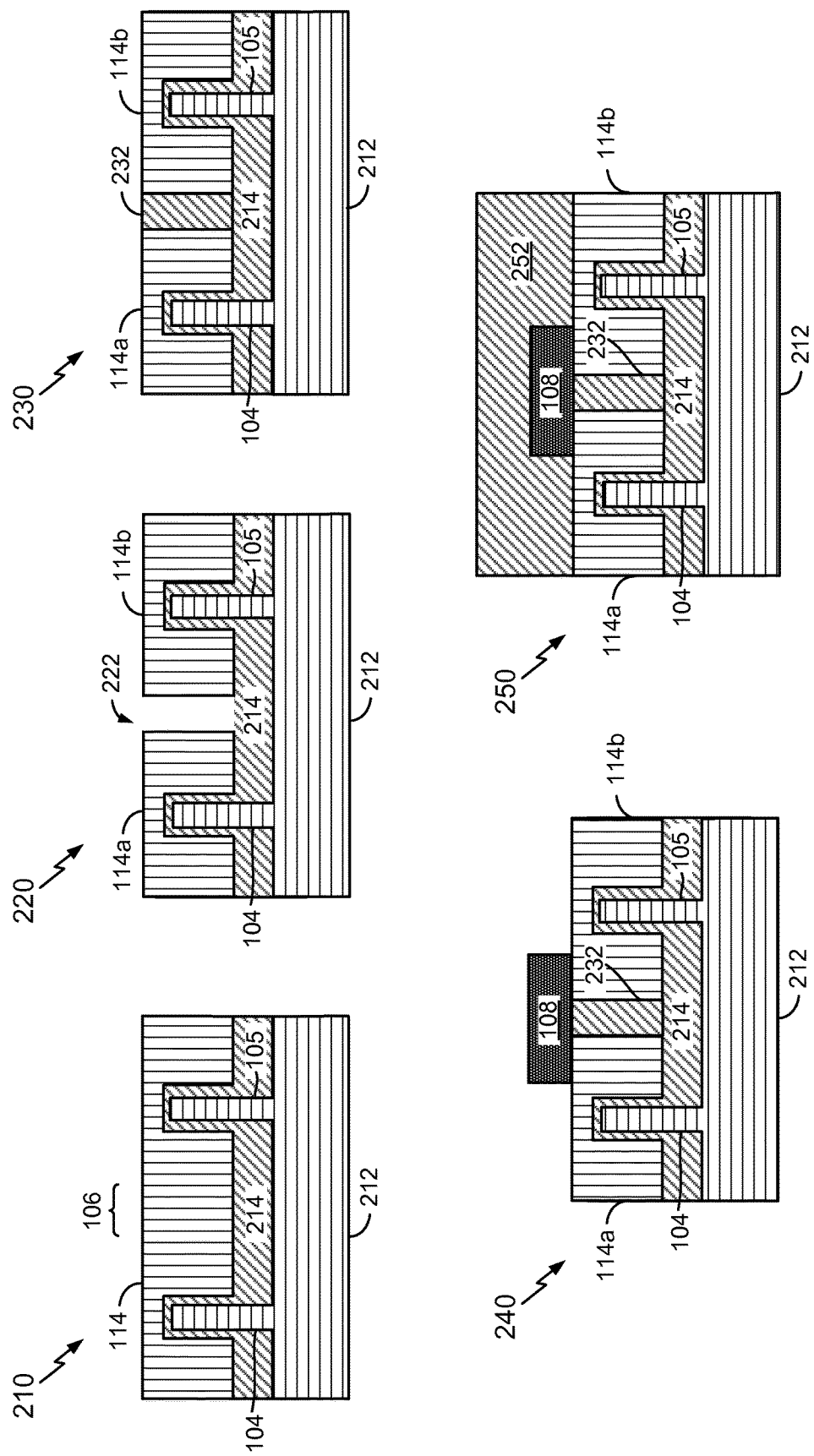
FIG. 2 depicts certain stages of an illustrative method of fabrication of a device that includes a conductive structure to connect gate regions separated using a gate cut.

FIG. 2 depicts certain stages of an illustrative method of fabrication of a device, such as the device 100 of FIG. 1. For example, FIG. 2 illustrates a first stage 210, a second stage 220, a third stage 230, a fourth stage 240, and a fifth stage 250 of the method of fabrication.

During the first stage 210, the fins 104, 105 may be formed from a substrate 212. For example, the fins 104, 105 may be defined using an etch process that etches a substrate 212. A dielectric material 214 (e.g., oxide) may be formed on the fins 104, 105 and on the substrate 212.

A gate line (e.g., the first gate line 114) is formed on the dielectric material 214. Depending on the particular fabrication process, the first gate line 114 may correspond to a dummy gate structure that is used to create a cavity for forming a replacement gate (e.g., a replacement metal gate in connection with a high-k metal gate process), or the first gate line 114 may correspond to a functional gate structure (e.g., a replacement metal gate). A portion of the first gate line 114 that is proximate to (e.g., that "wraps around") the fin 104 may correspond to a gate terminal of the first device 118 of FIG. 1, and a portion of the first gate line 114 that is proximate to the fin 105 may correspond to a gate terminal of the second device 119 of FIG. 1.

During the second stage 220, a gate cut may be performed at the gate cut region 106 to define the first gate region 114a and the second gate region 114b. The first gate region 114a and the second gate region 114b may be separated by a cavity 222.

During the third stage 230, a dielectric material 232 is filled between the first gate region 114a and the second gate region 114b. The dielectric material 232 may adjoin sidewalls of the first gate region 114a and the second gate region 114b and may also adjoin a top surface of the dielectric material 214. To further illustrate, the dielectric material 232 may include an interlayer dielectric (ILD) material, such as oxide, as an illustrative example. In some implementations, top surfaces of the first gate region 114a, the second gate region 114b, and the dielectric material 232 may be smoothed or planarized (e.g., using a planarization process).

During the fourth stage 240, the conductive structure 108 is formed. For example, in some implementations, a conductive material (e.g., a metal) may be deposited using a deposition process. In this example, after depositing the conductive material, the conductive material may patterned or etched (e.g., using an etch process) to define the conductive structure 108. The conductive structure 108 may adjoin top surfaces of the first gate region 114a, the second gate region 114b, and the dielectric material 232.

During the fifth stage 250, a dielectric material 252 has been formed. For example, the dielectric material 252 may adjoin a top surface and sidewalls of the conductive structure 108. The dielectric material 252 may also adjoin top surfaces of the first gate region 114a and the second gate region 114b.

Use of the conductive structure 108 may improve performance of one or more gate terminals formed using the first gate line 114 (e.g., gate terminals of the devices 118, 119 of FIG. 1). For example, use of the conductive structure 108 may enable a gate cut to be performed at the first gate line 114, which may "distribute" strain associated with neighboring cut gate lines (e.g., the gate lines 112, 116 of FIG. 1) among device components instead of focusing the strain on the devices 118, 119.

Figure 3:
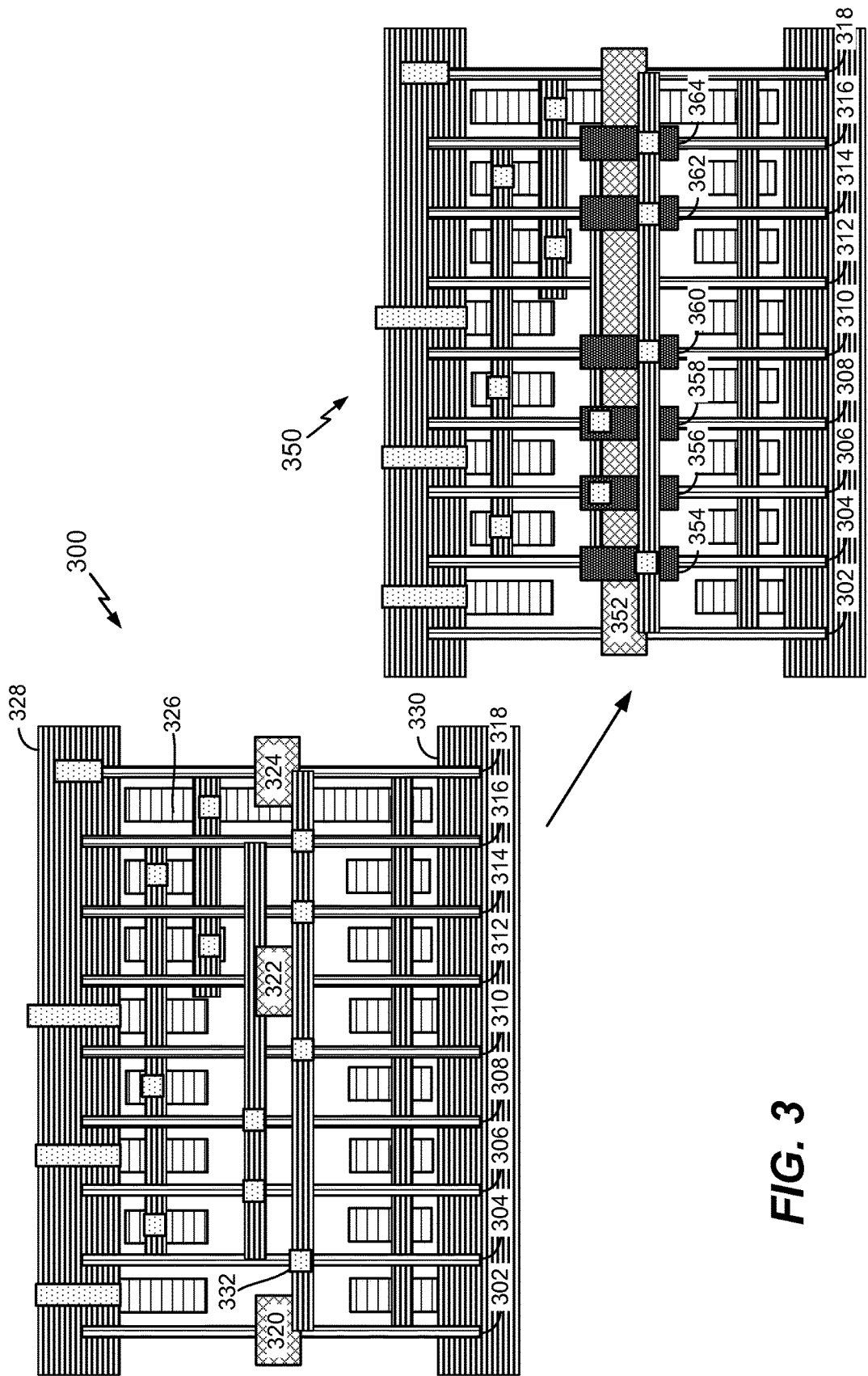
FIG. 3 depicts aspects of an illustrative process of generating a physical layout of a device that includes a conductive structure to connect gate regions separated using a gate cut.

FIG. 3 depicts aspects of an illustrative process of modifying a first physical layout 300 associated with a device to generate a second physical layout 350. For example, the device described with reference to FIG. 3 may correspond to the device 100 of FIG. 1. The physical layouts 300, 350 may represent physical characteristics of a circuit, such as a circuit that includes and-or-inverter (AOI) logic gates.

The first physical layout 300 includes multiple gate lines, such as gate lines 302, 304, 306, 308, 310, 312, 314, 316, and 318. One or more of the gate lines 302-318 may correspond to the gate lines 112, 114, and 116 of FIG. 1.

The first physical layout 300 indicates multiple gate cut regions associated with the multiple gate lines. For example, a gate cut region 320 is associated with the gate line 302, a gate cut region 322 is associated with the gate line 312, and a gate cut region 324 is associated with the gate line 318. One or more of the gate cut regions 320, 322, and 324 may correspond to the gate cut region 106 of FIG. 1.

The first physical layout 300 may further include multiple active areas (e.g., highly doped regions), such as a representative active area 326. One or more active areas of the first physical layout 300 may be formed within the substrate 212 of FIG. 2.

The first physical layout 300 may further include multiple metallization regions, such as representative metallization regions 328, 330. To illustrate, in some implementations, the metallization region 328 may include a supply voltage node (e.g., the supply voltage node 120 of FIG. 1), and the metallization region 330 may include a ground node (e.g., the ground node 122 of FIG. 1). The metallization regions 328, 330 may be formed using a first metal layer (M1) of a metallization process, such as a back-end-of-line (BEOL) metallization process.

The first physical layout 300 may further include multiple contacts, such as a representative contact 332. For example, a contact may adjoin (or "land on") either an active area (e.g., the active area 326) or a gate line (e.g., any of the gate lines 304, 306, 308, 310, 314, and 316).

One or more gate lines of the first physical layout 300 may be targeted for a gate cut based on one or more criteria, such as one or more criteria indicated by a schematic or circuit-level specification corresponding to the first physical layout 300. As an illustrative example, performing gates cut at the gate cut regions 320, 322, and 324 may separate a supply voltage node corresponding to the metallization region 328 from a ground node corresponding to the metallization region 330. In this example, a gate terminal of a p-type dummy device and a gate terminal of an n-type dummy device are to be formed from each of the gate lines 302, 312, and 318. The gate terminal of the p-type dummy device may be coupled to the supply voltage node using the metallization region 328, and the gate terminal of the n-type dummy device may be coupled to the ground node using the metallization region 330.

In other cases, one or more gate lines may not be targeted for a gate cut. For example, in the first physical layout 300, none of the gate lines 304, 306, 308, 310, 314, and 316 is targeted for a gate cut. To further illustrate, one or more of the gate lines 304, 306, 308, 310, 314, and 316 may correspond to an inverter that includes a p-type device (e.g., a p-type finFET) having a gate terminal that is coupled to a gate terminal of an n-type device (e.g., an n-type finFET) of the inverter.

In some cases, a gate cut may affect operation of a device fabricated based on the first physical layout 300. For example, differences in lengths of adjacent gate lines due to a gate cut may change device operation due to strain (e.g., tensile strain or compressive strain). As an example, a gate cut may be performed at the gate cut region 324 to create a cavity, and the cavity may be filled with a dielectric that causes strain at the gate line 316. The strain may alter one or more operating characteristics (e.g., a magnitude of a saturation current) of devices having gate terminals formed using the gate line 316 (e.g., the devices 118, 119 of FIG. 1).

To further illustrate, the first physical layout 300 may indicate fabrication of a gate terminal of a first p-type device (e.g., the first device 118 of FIG. 1) and a gate terminal of a first n-type device (e.g., the second device 119 of FIG. 1) from the gate line 316 without using a gate cut and may also indicate fabrication of a gate terminal of a second p-type device (e.g., a dummy transistor) and a gate terminal of a second n-type device (e.g., a dummy transistor) from the gate line 318 using a gate cut at the gate cut region 324. Cutting the gate line 318 at the gate cut region 324 may create a cavity, which may be filled with a dielectric that causes strain at the first p-type device and the first n-type device.

In some cases, strain may affect p-type devices differently as compared to n-type devices. For example, compressive strain may reduce saturation current magnitude of an n-type device and may increase saturation current magnitude of a p-type device in some applications. As another example, tensile strain may increase saturation current magnitude of an n-type device and may reduce saturation current magnitude of a p-type device in some applications. In these examples, strain associated with a gate cut at the gate cut region 324 may cause a "mismatch" between the first p-type device and the first n-type device (e.g., by increasing saturation current magnitude of the first n-type device while decreasing saturation current magnitude of the first p-type device).

In this case, operation of the first p-type device may differ from operation of the first n-type device, the second p-type device, and the second n-type device. In addition, operation of the first n-type device may differ from operation of the first p-type device, the second p-type device, and the second n-type device.

Further, devices having gate terminals formed from the gate line 316 may operate differently as compared to devices having gate terminals formed from a gate line that is not adjacent to a gate cut region. To illustrate, FIG. 3 depicts that the gate line 306 is not adjacent to a gate line targeted for a gate cut and that the gate line 316 is adjacent to a gate line targeted for a gate cut (the gate line 318). If the gate lines 306, 316 each correspond to an inverter that includes a p-type device and an n-type device, the p-type device and the n-type device of the gate line 306 may have operating characteristics that are different than operating characteristics of the p-type device and the n-type device of the gate line 316. For example, saturation current magnitudes of the p-type device and the n-type device of the gate line 306 may be different than saturation current magnitudes of the p-type device and the n-type device of the gate line 316.

In this example, operation of a circuit fabricated based on the first physical layout 300 may deviate from a design specification of the circuit. For example, a "mismatch" between saturation current magnitudes of devices having gate terminals formed from the gate line 306 as compared to saturation current magnitudes of devices having gate terminals formed from the gate line 316 may reduce device performance or cause unintended device operation. Some conventional techniques may compensate for gate cut effects by avoiding gate cuts, relocating device components to avoid proximity of devices to gate cuts, or increasing distance between devices. These techniques may increase fabrication costs (e.g., by using additional wiring and by creating additional design rules) and may also increase device size.

An illustrative process in accordance with the disclosure may include modifying the first physical layout 300 to generate the second physical layout 350. For example, the second physical layout 350 may indicate a gate cut region 352 (e.g., a region selected for a flush cut). Each of the gate lines 302, 304, 306, 308, 310, 312, 314, 316, and 318 may be cut using a gate cut that targets the gate cut region 352.

The second physical layout 350 may also indicate conductive structures 354, 356, 358, 360, 362, and 364. Any of conductive structures 354, 356, 358, 360, 362, and 364 may be as described with reference to the conductive structure 108 of FIGS. 1 and 2. The conductive structures 354, 356, 358, 360, 362, and 364 may be formed to "reconnect" portions of the gate lines 304, 306, 308, 310, 314, and 316 after separating the portions by performing a gate cut at the gate cut region 352. Accordingly, a circuit schematic associated with the first physical layout 300 may correspond to (e.g., may be equivalent to) a circuit schematic associated with the second physical layout 350.

Performing a gate cut at the gate cut region 352 may reduce variation of device operating characteristics. For example, by cutting each of the gate lines 302, 304, 306, 308, 310, 312, 314, 316, and 318, variation of operating characteristics due to different distances from a device to a gate cut may be reduced or avoided.

Figure 4:
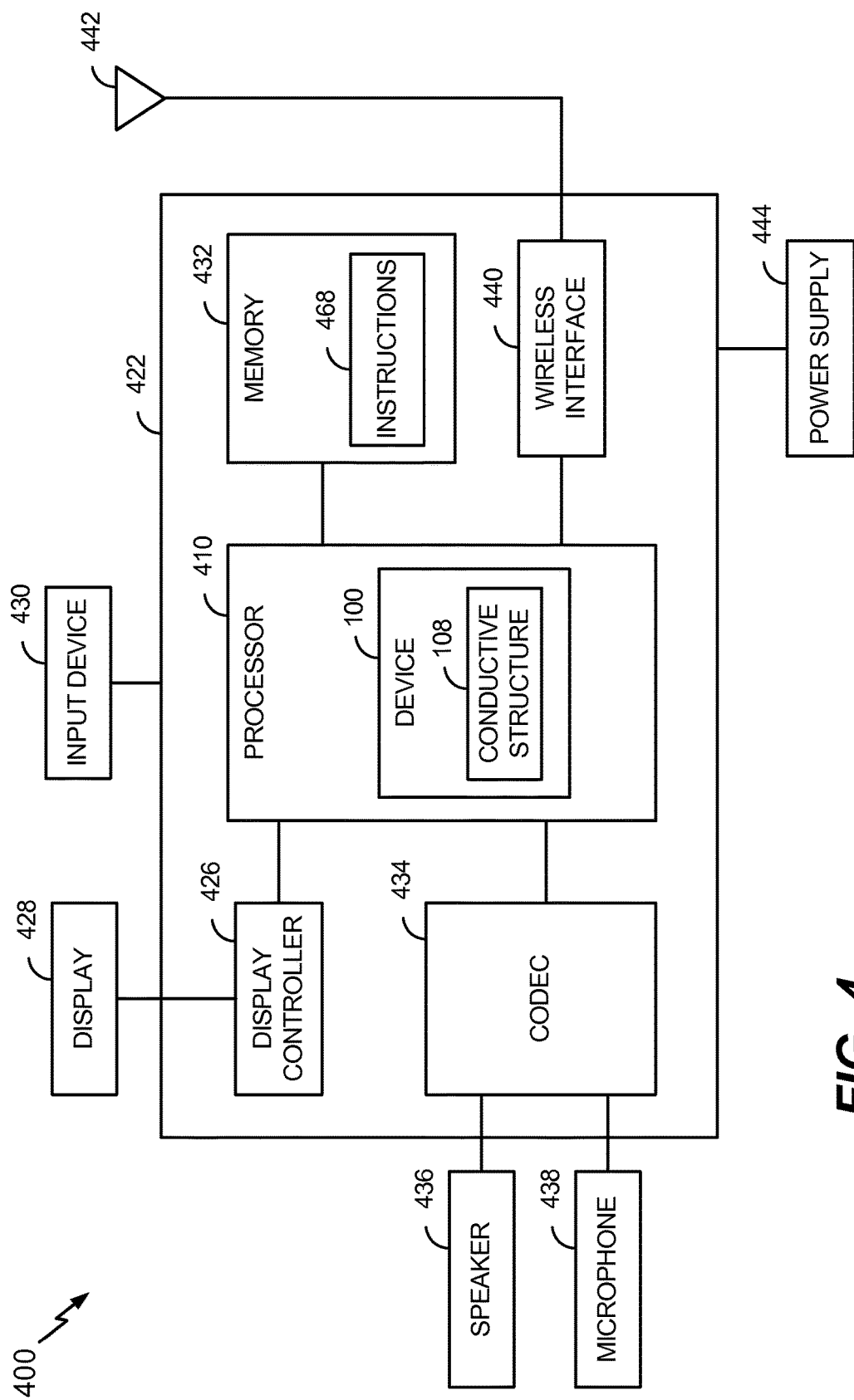
FIG. 4 is a block diagram of an illustrative example of an electronic device including a conductive structure to connect gate regions separated using a gate cut.

Referring to FIG. 4, a block diagram of a particular illustrative embodiment of an electronic device is depicted and generally designated 400. The electronic device 400 may correspond to a mobile device (e.g., a cellular telephone), as an illustrative example. In other implementations, the electronic device 400 may correspond to a computer (e.g., a laptop computer, a tablet computer, or a desktop computer), a wearable electronic device (e.g., a personal camera, a head-mounted display, or a watch), a vehicle control system or console, a home appliance, a set top box, an entertainment unit, a navigation device, a personal digital assistant (PDA), a television, a monitor, a tuner, a radio (e.g., a satellite radio), a music player (e.g., a digital music player or a portable music player), a video player (e.g., a digital video player, such as a digital video disc (DVD) player or a portable digital video player), a robot, a healthcare device, another electronic device, or a combination thereof.

The electronic device 400 includes a processor 410, such as a digital signal processor (DSP), a central processing unit (CPU), a graphics processing unit (GPU), another processing device, or a combination thereof. The processor 410 may include the device 100, and the device 100 may include the conductive structure 108. Alternatively or in addition, one or more other components of the electronic device 400 may include a device corresponding to the device 100. Further, one or more components of the electronic device 400 may include a circuit fabricated in accordance with the method described with reference to FIG. 2, the second physical layout 350 of FIG. 3, or a combination of both.

The electronic device 400 may further include a memory 432. The memory 432 may be coupled to or integrated within the processor 410. The memory 432 may store instructions 468 that are executable by the processor 410. To further illustrate, the memory 432 may include random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), one or more registers, a hard disk, a removable disk, a compact disc read-only memory (CD-ROM), another storage device, or a combination thereof.

FIG. 4 also shows a display controller 426 that is coupled to the processor 410 and to a display 428. A coder/decoder (CODEC) 434 can also be coupled to the processor 410. A speaker 436 and a microphone 438 can be coupled to the CODEC 434. FIG. 4 also indicates that a wireless interface 440, such as a wireless controller and/or a transceiver, can be coupled to the processor 410 and to an antenna 442.

In a particular embodiment, the processor 410, the display controller 426, the memory 432, the CODEC 434, and the wireless interface 440 are included in a system-in-package or system-on-chip device 422. Further, an input device 430 and a power supply 444 may be coupled to the system-on-chip device 422. Moreover, in a particular embodiment, as illustrated in FIG. 4, the display 428, the input device 430, the speaker 436, the microphone 438, the antenna 442, and the power supply 444 are external to the system-on-chip device 422. However, each of the display 428, the input device 430, the speaker 436, the microphone 438, the antenna 442, and the power supply 444 can be coupled to a component of the system-on-chip device 422, such as to an interface or to a controller.

Figure 5:
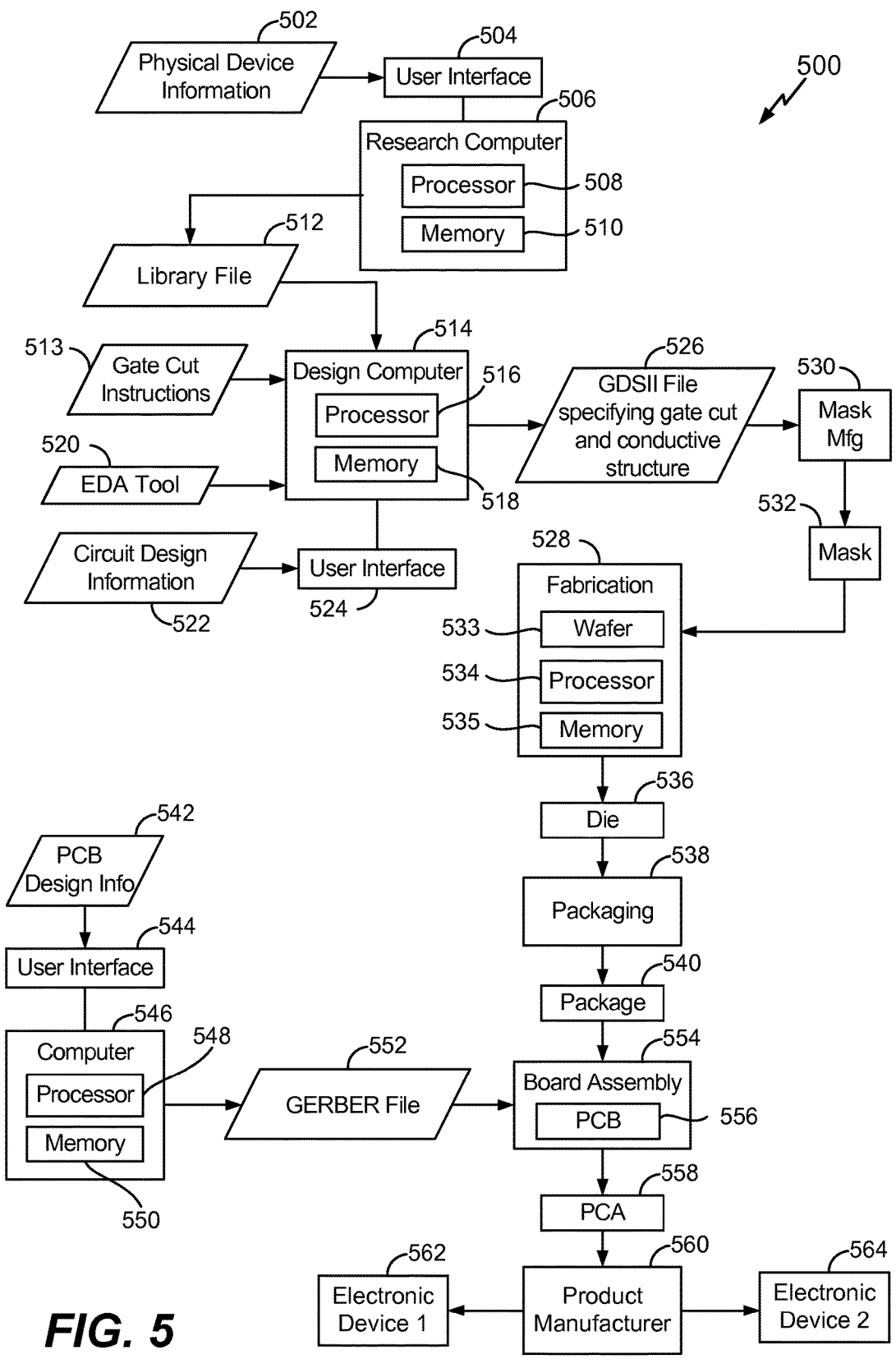
FIG. 5 is a data flow diagram of an illustrative example of a manufacturing process to manufacture one or more electronic devices that include a conductive structure to connect gate regions separated using a gate cut.

The foregoing disclosed devices and functionalities may be designed and represented using computer files (e.g. RTL, GDSII, GERBER, etc.). The computer files may be stored on computer-readable media. Some or all such files may be provided to fabrication handlers who fabricate devices based on such files. Resulting products include wafers that are then cut into die and packaged into integrated circuits (or "chips"). The chips are then employed in electronic devices, such as the electronic device 400 of FIG. 4. FIG. 5 depicts a particular illustrative embodiment of an electronic device manufacturing process 500.

Physical device information 502 is received at the electronic device manufacturing process 500, such as at a research computer 506. For example, the physical device information 502 may include physical parameters, material characteristics, and structure information that is entered via a user interface 504 coupled to the research computer 506. The research computer 506 includes a processor 508, such as one or more processing cores. The processor 508 is coupled to a computer-readable medium, such as a memory 510. The memory 510 may store computer-readable instructions that are executable by the processor 508 to transform the physical device information 502 to comply with a file format and to generate a library file 512.

The library file 512 may include at least one data file including the transformed design information. For example, the library file 512 may specify a library of devices. The library file 512 may be used in conjunction with an electronic design automation (EDA) tool 520 at a design computer 514. The design computer 514 includes a processor 516, such as one or more processing cores. The processor 516 is coupled to a memory 518. The EDA tool 520 may include processor executable instructions stored at the memory 518 to enable a user of the design computer 514 to design a circuit. For example, a user of the design computer 514 may enter circuit design information 522 via a user interface 524 coupled to the design computer 514. The circuit design information 522 may include design information representing at least one physical property of a device. To illustrate, the circuit design property may include identification of particular circuits and relationships to other elements in a circuit design, positioning information, feature size information, interconnection information, or other information representing a physical property of a device.

The design computer 514 may be configured to transform the circuit design information 522 to comply with a file format. To illustrate, the file format may include a database binary file format representing planar geometric shapes, text labels, and other information related to a circuit layout in a hierarchical format, such as a Graphic Data System (GDSII) file format. The design computer 514 may be configured to generate a data file including the transformed design information, such as a GDSII file 526 that includes information describing at least one component of the device 100 of FIG. 1 (e.g., the conductive structure 108), at least one component indicated by the second physical layout 350 (e.g., one or more of the conductive structures 354-364), or a combination thereof.

In an illustrative example, one or more processors described with reference to FIG. 5 may execute gate cut instructions 513 to generate design information (e.g., the GDSII file 526) specifying a gate cut region (e.g., any of the gate cut regions 106 and 352) and a conductive structure (e.g., any of the conductive structures 108 and 354-364).

To illustrate, the processor 516 may execute the gate cut instructions 513 to analyze the circuit design information 522 to identify a gate line neighboring a gate cut that may produce a gate cut effect or that may be noncompliant with a design rule associated with a fabrication process. As an example, the processor 516 may access the gate cut instructions 513 to analyze the circuit design information 522 to determine that the first gate line 114 is adjacent to the gate lines 112, 116 (which are targeted for a gate cut), to determine that the first gate line 114 is noncompliant with a design rule due to being too near the gate lines 112, 116 (which are targeted for a gate cut), or both. In response to analyzing the circuit design information 522 to identify the first gate line 114, the processor 516 may execute the gate cut instructions 513 to cause the GDSII file 526 to indicate that the first gate line 114 is to be cut to define the gate regions 114a, 114b and to indicate that the gate regions 114a, 114b are to be connected using the conductive structure 108.

Alternatively or in addition, the processor 516 may execute the gate cut instructions 513 to modify a representation of the first physical layout 300, such as by "replacing" the gate cut regions 320, 322, and 324 with the gate cut region 352 (e.g., to reduce a gate cut effect at the gate lines 304, 306, 308, 310, 314, and 316, to enable compliance with one or more design rules, or a combination of both). In this example, the processor 516 may execute the gate cut instructions 513 to cause the GDSII file 526 to indicate the second physical layout 350 (instead of indicating the first physical layout 300).

The GDSII file 526 may be received at a fabrication process 528. The fabrication process 528 may use the GDSII file to fabricate a semiconductor device that includes at least one component of the device 100 of FIG. 1 (e.g., the conductive structure 108), at least one component indicated by the second physical layout 350 (e.g., the conductive structures 354-364), or a combination thereof.

The GDSII file 526 may be provided to a mask manufacturer 530 to create one or more masks, such as masks to be used with photolithography processing, illustrated in FIG. 5 as a representative mask 532. The mask 532 may be used during the fabrication process 528 to generate one or more wafers 533, which may be tested and separated into dies, such as a representative die 536 (e.g., a semiconductor die). The die 536 may include at least one component of the device 100 of FIG. 1 (e.g., the conductive structure 108), at least one component indicated by the second physical layout 350 (e.g., the conductive structures 354-364), or a combination thereof.

Operations of the fabrication process 528 may be initiated or controlled using a processor 534 and a memory 535. The memory 535 may store instructions that are executable by the processor 534.

The fabrication process 528 may be implemented by a fabrication system that is fully automated or partially automated. For example, the fabrication process 528 may be automated according to a schedule. The fabrication system may include fabrication equipment (e.g., processing tools) to perform one or more operations to form a device. For example, the fabrication equipment may be configured to deposit one or more materials, epitaxially grow one or more materials, conformally deposit one or more materials, apply a hardmask, apply an etching mask, perform etching, perform planarization, form a gate stack (e.g., using a metal gate process), perform a shallow trench isolation (STI) process, and/or perform a standard clean 1 process, as illustrative examples.

The fabrication system may have a distributed architecture (e.g., a hierarchy). For example, the fabrication system may include one or more processors, such as the processor 534, one or more memories, such as the memory 535, and/or one or more controllers that are distributed according to the distributed architecture. The distributed architecture may include a high-level processor that controls or initiates operations of one or more low-level systems. For example, a high-level portion of the fabrication process 528 may be initiated or controlled by one or more processors, such as the processor 534, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the high-level processor. Each of the one or more low-level systems may be associated with one or more corresponding pieces of fabrication equipment, such as one or more processing tools. Example processing tools include doping or deposition tools (e.g., a molecular beam epitaxial growth tool, a flowable chemical vapor deposition (FCVD) tool, a conformal deposition tool, or a spin-on deposition tool) and removal tools (e.g., a chemical removal tool, a reactive gas removal tool, a hydrogen reaction removal tool, or a standard clean 1 removal tool).

In a particular embodiment, the fabrication system may include multiple processors that are distributed in the fabrication system. For example, a controller of a low-level system component may include a processor, such as the processor 534. Alternatively, the processor 534 may be a part of a high-level system, subsystem, or component of the fabrication system. In another embodiment, the processor 534 includes distributed processing at various levels and components of a fabrication system.

The die 536 may be provided to a packaging process 538. The packaging process 538 may incorporate the die 536 into a representative package 540. The package 540 may include a single die (such as the die 536) or multiple dies, such as in connection with a system-in-package (SiP) arrangement. The package 540 may be configured to conform to one or more standards or specifications, such as one or more Joint Electron Device Engineering Council (JEDEC) standards.

Information regarding the package 540 may be distributed to various product designers, such as using a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged device on a circuit board. The packaged device may include at least one component of the device 100 of FIG. 1 (e.g., the conductive structure 108), at least one component indicated by the second physical layout 350 (e.g., the conductive structures 354-364), or a combination thereof.

The computer 546 may be configured to transform the PCB design information 542 to generate a data file, such as a GERBER file 552. The GERBER file 552 may indicate physical positioning information of a packaged device on a circuit board, as well as layout of electrical connections, such as traces and vias. The packaged device may include at least one component of the device 100 of FIG. 1 (e.g., the conductive structure 108), at least one component indicated by the second physical layout 350 (e.g., the conductive structures 354-364), or a combination thereof. In other implementations, the data file generated by transforming PCB design information 542 may have a format other than a GERBER format.

The GERBER file 552 may be received at a board assembly process 554 and used to create PCBs, such as a representative PCB 556. The PCB 556 may be manufactured in accordance with the design information indicated by the GERBER file 552. For example, the GERBER file 552 may be uploaded to one or more machines to perform one or more operations of a PCB production process. The PCB 556 may be populated with electronic components including the package 540 to form a representative printed circuit assembly (PCA) 558.

The PCA 558 may be received at a product manufacture process 560 and integrated into one or more electronic devices, such as a first representative electronic device 562 and a second representative electronic device 564. For example, the first representative electronic device 562 and/or the second representative electronic device 564 may include or correspond to the electronic device 400 of FIG. 4. The first representative electronic device 562 and/or the second representative electronic device 564 may include a mobile device (e.g., a cellular telephone), as an illustrative example. In other implementations, the electronic device 400 may correspond to a computer (e.g., a laptop computer, a tablet computer, or a desktop computer), a wearable electronic device (e.g., a personal camera, a head-mounted display, or a watch), a vehicle control system or console, a home appliance, a set top box, an entertainment unit, a navigation device, a personal digital assistant (PDA), a television, a monitor, a tuner, a radio (e.g., a satellite radio), a music player (e.g., a digital music player or a portable music player), a video player (e.g., a digital video player, such as a digital video disc (DVD) player or a portable digital video player), a robot, a healthcare device, another electronic device, or a combination thereof.

One or more aspects of the embodiments described with respect to FIGS. 1-5 may be represented by the library file 512, the GDSII file 526, and/or the GERBER file 552. One or more aspects of the embodiments described with respect to FIGS. 1-5 may be represented by information stored at the memory 510 of the research computer 506, the memory 518 of the design computer 514, the memory 550 of the computer 546, and/or a memory of one or more other computers or processors (not shown) used at the various stages, such as at the board assembly process 554. One or more aspects of the embodiments described with respect to FIGS. 1-5 may be can also be incorporated into one or more other physical embodiments, such as the mask 532, the die 536, the package 540, the PCA 558, other products such as prototype circuits or devices (not shown), or any combination thereof. Although various representative stages of production from a physical device design to a final product are depicted, in other embodiments fewer stages may be used or additional stages may be included. Similarly, the electronic device manufacturing process 500 may be performed by a single entity or by one or more entities performing various stages of the electronic device manufacturing process 500.

Figure 6:
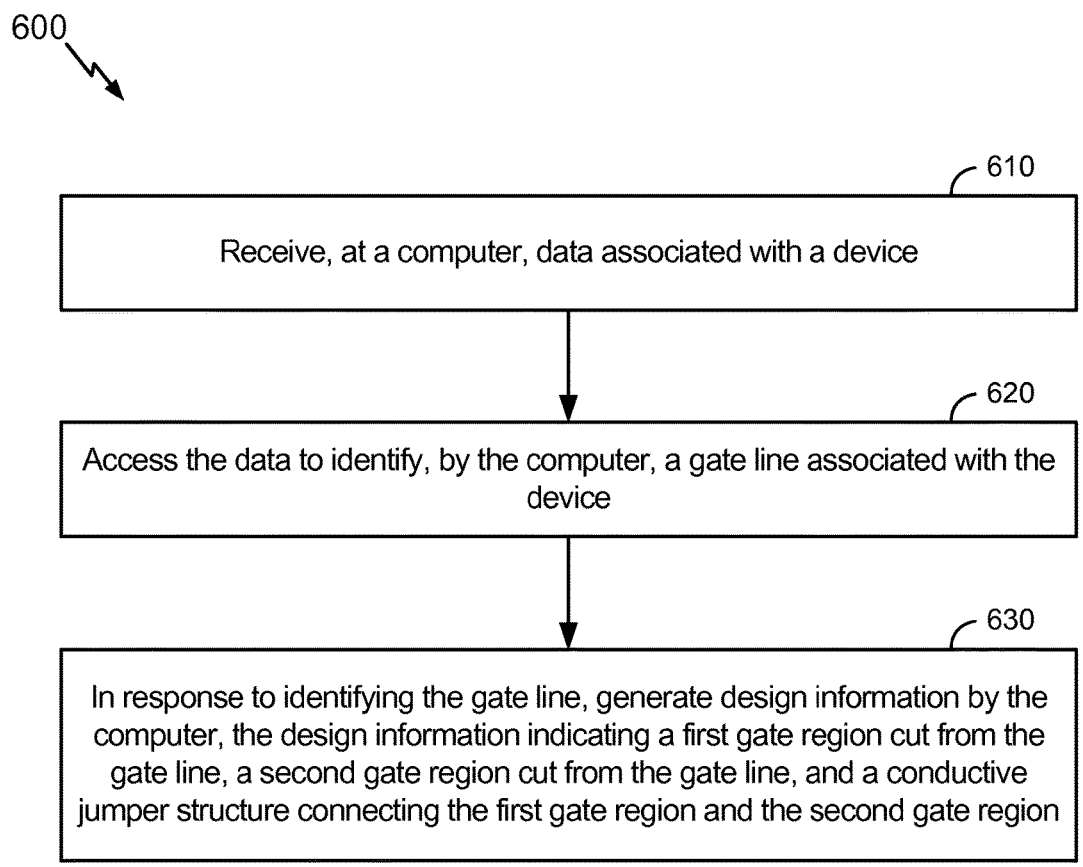
FIG. 6 depicts an illustrative method of generating design information associated with a device that includes a conductive structure to connect gate regions separated using a gate cut.

Referring to FIG. 6, an illustrative example of a method of generating design information associated with a device is depicted and generally designated 600. For example, the method 600 may generate design information associated with the device 100 of FIG. 1, design information corresponding to the second physical layout 350 of FIG. 3, design information associated with the system-on-chip device 422 of FIG. 4, design information associated with the die 536 of FIG. 5, or a combination thereof.

The method 600 includes receiving data associated with a device, at 610. The data is received at a computer. In an illustrative implementation, the computer corresponds to the design computer 514, and the data includes any of the library file 512, the EDA tool 520, the circuit design information 522, or a combination thereof. In other examples, operations of the method 600 may be performed at another computer, such as at the research computer 506, at a computer that includes the processor 534 and the memory 535, another computer, or a combination thereof.

The method 600 further includes accessing the data to identify, by the computer, a gate line associated with the device, at 620. For example, the processor 516 of the design computer 514 may execute the gate cut instructions 513 to identify the second gate line 112, one or more of the gate lines 304, 306, 308, 310, 314, and 316, or a combination thereof. To further illustrate, the gate line may be identified in response to determining that the gate line neighbors a gate cut region (e.g., a gate cut region of the second gate line 112, a gate line region of the third gate line 116, any of the gate cut regions 320, 322, and 324, or a combination thereof).

The method 600 further includes generating design information by the computer in response to identifying the gate line, at 630. In an illustrative example, the design information includes a data file, such as the GDSII file 526. The design information indicates a first gate region (e.g., the first gate region 114a) cut from the gate line, a second gate region (e.g., the second gate region 114b) cut from the gate line, and a conductive jumper structure (e.g., the conductive structure 108) coupling the first gate region and the second gate region.

In an illustrative example, the data indicates a first physical layout of the device (e.g., the first physical layout 300), and generating the design information includes modifying the first physical layout to generate a second physical layout (e.g., the second physical layout 350) of the device indicated by the design information. A circuit schematic associated with the first physical layout may correspond to a circuit schematic associated with the second physical layout. For example, the physical layouts 300, 350 may be associated with a common circuit schematic.

In some applications, the data does not specify that the gate line is to be separated into multiple regions. For example, the data may not specify that the gate line is to be cut using a gate cut until the processor 516 executes the gate cut instructions 513 to determine that the gate line is to be cut (e.g., to reduce a gate cut effect or to enable compliance with one or more design rules).

Figure 7:
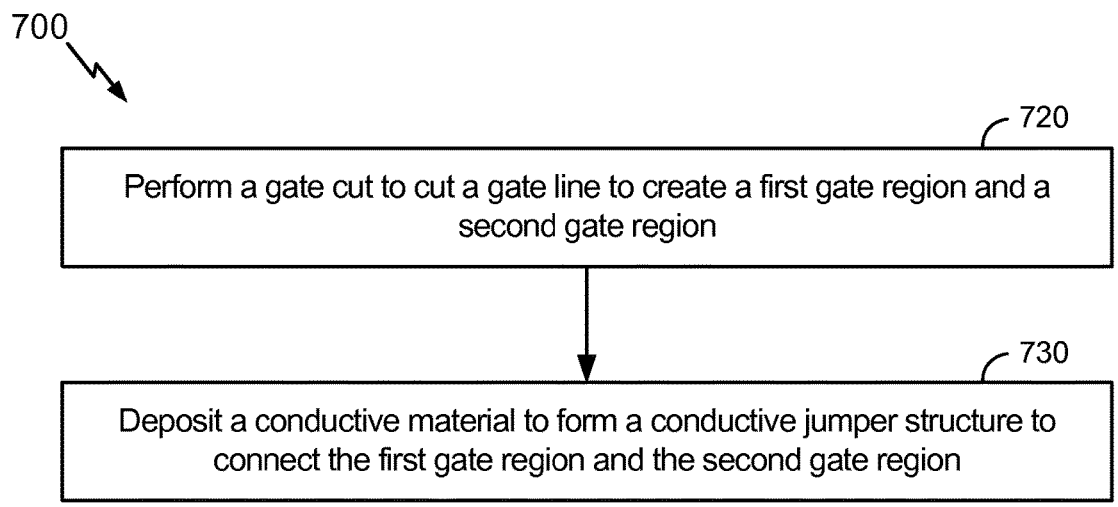
FIG. 7 depicts an illustrative method of fabrication of a device that includes a conductive structure to connect gate regions separated using a gate cut.

Referring to FIG. 7, an illustrative example of a method of fabrication of a device is depicted and generally designated 700. For example, the method 700 may be used to fabricate the device 100 of FIG. 1, a device corresponding to the second physical layout 350 of FIG. 3, the system-on-chip device 422 of FIG. 4, the die 536 of FIG. 5, or a combination thereof.

The method 700 may include performing a gate cut to cut a gate line to create a first gate region and a second gate region, at 720. For example, the gate line may correspond to any of the gate lines 114, 304, 306, 308, 310, 314, and 316. In some applications, the gate line may be formed using a replacement metal gate (RMG) process or another process. The gate line may include poly-silicon or one or more other materials. To further illustrate, the first gate region may correspond to the first gate region 114a, and the second gate region may correspond to the second gate region 114b. As another example, the first gate region and the second gate region may correspond to portions of one of the gate lines 304-310, 314, and 316. Performing the gate cut may include etching the gate line or scribing the gate line, as illustrative examples. Performing the gate cut may include performing a flush cut. For example, a flush cut may include separating a plurality of gate lines using a single cutting operation, such as by cutting each of the gate lines 112, 114, 116 using a single cutting operation or by cutting each of the gate lines 302-318 using a single cutting operation.

The method 700 may include depositing a conductive material to form a conductive jumper structure to connect the first gate region and the second gate region, at 730. For example, the conductive jumper structure may correspond to any of the conductive structures 108 and 354-364. Forming the conductive jumper structure may include forming (e.g., depositing) a metal (e.g., M0) during middle-of-line (MOL) processing of the device.

The method 700 may further include forming a dielectric material between the first gate region and the second gate region (after performing the gate cut and prior to depositing the conductive material). For example, the dielectric material 232 may be formed between the gate regions 114a, 114b. The conductive jumper structure may adjoin (e.g., contact) the dielectric material. For example, the conductive structure 108 may be formed on the dielectric material 232 using a deposition process.

The method 700 may further include forming a dummy gate line adjacent to the gate line, and performing the gate cut may include cutting the dummy gate line at a same location as the gate line to form a third gate region and a fourth gate region. For example, the dummy gate line may correspond to any of the gate lines 112, 116, 302, 312, and 318. The third gate region and the fourth gate region may correspond to the gate regions 112a, 112b, the gate regions 116a, 116b, or gate regions formed by cutting the gate line 302, the gate line 312, or the gate line 318. In some applications, a conductive jumper structure is not formed to connect the third gate region to the fourth gate region after cutting the dummy gate line, such as if the third gate region and the fourth gate region are to be coupled to the supply voltage node 120 and the ground node 122, respectively.

Forming the gate line, performing the gate cut, and forming the conductive structure may be initiated or controlled by a processor executing instructions accessed from a memory. For example, forming the gate line, performing the gate cut, and forming the conductive structure may be initiated or controlled by the processor 534 executing instructions retrieved from the memory 535 in connection with operations of the fabrication process 528.

A computer-readable medium (e.g., the memory 535) may store instructions executable by a processor (e.g., the processor 534) to perform operations during fabrication (e.g., during the fabrication process 528) of a device (e.g., the device 100 of FIG. 1, a device corresponding to the second physical layout 350 of FIG. 3, the system-on-chip device 422 of FIG. 4, the die 536 of FIG. 5, or a combination thereof). The operations may include initiating a gate cut on a gate line (e.g., any of the gate lines 114, 304, 306, 308, 310, 314, and 316) to create a first gate region and a second gate region (e.g., the first gate region 114a and the second gate region 114b or portions of one of the gate lines 304-310, 314, and 316). The operations may further include initiating formation (e.g., deposition) of a conductive material to form a conductive jumper structure (e.g., any of the conductive structures 108 and 354-364) to connect the first gate region and the second gate region.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. For example, one or more operations of the methods 600 and 700 may be initiated, controlled, or performed by a field-programmable gate array (FPGA) device, an application-specific integrated circuit (ASIC), a processing unit such as a central processing unit (CPU), a digital signal processor (DSP), a controller, another hardware device, a firmware device, or a combination thereof. A software module may reside in random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transitory storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a first device including a first gate region;
   a second device including a second gate region, the first gate region and the second gate region formed from a first gate line;
   a conductive jumper structure coupling the first gate region and the second gate region;
   a first dummy device having a gate terminal formed from a second gate line, the first dummy device adjacent to the first device and the second gate line proximate to the first gate line;
   a second dummy device having a gate terminal formed from a third gate line, the second dummy device adjacent to the first device and the third gate line proximate to the first gate line, wherein the first gate line is located between the second gate line and the third gate line, wherein each of the first gate line, the second gate line, and the third gate line have a gate cut; and
   a first dielectric material within a region defined by the gate cut of the first gate line, the first dielectric material adjoining the first gate region and the second gate region, and including a first surface, the first surface of the first dielectric material, a surface of the first gate region, and a surface of the second gate region defining a planarized surface.

2. The apparatus of claim 1, further comprising a third dummy device having a gate terminal formed from the second gate line, the third dummy device adjacent to the second device.

3. The apparatus of claim 2, wherein a gate terminal of the first device is coupled to a gate terminal of the second device via the conductive jumper structure, wherein the gate terminal of the first dummy device is coupled to a supply voltage node, and wherein the gate terminal of the third dummy device is coupled to a ground node.

4. The apparatus of claim 1, further comprising a dielectric material formed between the first gate region and the second gate region.

5. The apparatus of claim 4, wherein the conductive jumper structure adjoins the dielectric material.

6. The apparatus of claim 1, wherein the first device includes a first fin field-effect transistor (finFET), and wherein the second device includes a second finFET.

7. The apparatus of claim 1, wherein the first device includes a p-type device, wherein the second device includes an n-type device, and wherein the gate cut is configured to reduce a mismatch between the p-type device and the n-type device.

8. The apparatus of claim 1, wherein the first device includes a p-type fin field-effect transistor (finFET), and wherein the second device includes an n-type finFET.

9. The apparatus of claim 1, further comprising a semiconductor die that includes the first device, the second device, and the conductive jumper structure.

10. The apparatus of claim 9, further comprising a device selected from the group consisting of a mobile device, a laptop computer, a tablet computer, a desktop computer, a wearable electronic device, a vehicle control system or console, a home appliance, a set top box, an entertainment unit, a navigation device, a personal digital assistant (PDA), a television, a monitor, a tuner, a radio, a music player, a video player, a robot, a healthcare device, and a combination thereof, wherein the device includes the semiconductor die.

11. The apparatus of claim 1, wherein the gate cut of the first gate line is located between the first device and the second device, and wherein the gate cuts of the first, second and third gate lines are aligned along at least one axis.

12. The apparatus of claim 11, wherein the at least one axis is perpendicular to the first gate line, and wherein the gate cut of the first gate line is located at a center of the first gate line, the gate cut of the second gate line is located at a center of the second gate line, and the gate cut of the third gate line is located at a center of the third gate line.

13. The apparatus of claim 8, wherein the p-type finFET device includes a first fin and the n-type finFET device includes a second fin, and further comprising:
   a substrate; and
   a second dielectric material on the substrate and adjoining the first fin and the second fin;
   the second dielectric material in contact with the first dielectric material,
   wherein the conductive jumper structure is on the planarized surface and is in direct contact with the first gate region, the second gate region, and the first dielectric material.

14. An apparatus comprising:
   a first gate line, wherein the first gate line includes a first gate region of a first fin field-effect transistor (finFET) and a second gate region of a second finFET;
   a conductive jumper structure coupling the first gate region of the first finFET and the second gate region of the second finFET, wherein the first gate line has a gate cut;
   a substrate;
   a first dielectric material on the substrate and adjoining a first fin of the first finFET and a second fin of the second finFET; and
   a second dielectric material within a region defined by the gate cut, the second dielectric material in contact with the first dielectric material, adjoining the first gate region and the second gate region, and including a first surface, the first surface of the second dielectric material, a surface of the first gate region, and a surface of the second gate region defining a planarized surface,
   wherein the conductive jumper structure is in contact with the second dielectric material.

15. The apparatus of claim 14, wherein the conductive jumper structure includes a layer of material that is in direct physical contact with the first gate region, the second gate region, and the second dielectric material.

* * * * *